United States Patent [19]

Tompa

[11] Patent Number: 5,650,201
[45] Date of Patent: Jul. 22, 1997

[54] METHOD FOR PRODUCING CARBON NITRIDE FILMS

[75] Inventor: Gary Steven Tompa, Somerville, N.J.

[73] Assignee: Structured Materials Industries Inc., Piscataway, N.J.

[21] Appl. No.: 515,114

[22] Filed: Aug. 14, 1995

[51] Int. Cl.$^6$ .................................................. C23C 14/48
[52] U.S. Cl. ..................... 427/523; 427/533; 427/577; 427/255.5; 427/249
[58] Field of Search .................................. 427/523, 533, 427/577, 255.5, 249

[56] References Cited

U.S. PATENT DOCUMENTS

| | | | |
|---|---|---|---|
| 4,664,976 | 5/1987 | Kimura et al. | 428/336 |
| 5,110,679 | 5/1992 | Haller et al. | 428/408 |
| 5,405,515 | 4/1995 | Fang | 204/164 |
| 5,466,941 | 11/1995 | Kim | 250/423 R |

OTHER PUBLICATIONS

Marton et al, "Synthesis of carbon–nitride film using a fast-switched dual-source low energy ion beam deposition system", Nucl. Instrum. Methods Phys. Res., Sec. B, 90(1–4) pp. 277–281, 1994.

Riviere et al, "Formation of the crystalline beta–$C_3N_4$ phase by dual ion beam sputtering deposition", Mater. Lett., 22(1, 2) 1995, pp. 115–118.

Experimental Realization Of The Covalent Solid Carbon Nitride, Science vol. 261 (16 Jul.1993) pp. 334–337.

Self–Extraction Negative Ion Source, Rev. Sci. Instrum 53(6) Jun. 1982 pp. 802–809.

Prediction Of New Low Compressibility Solids Science 25 Aug. 1989 p. 841 (Abstract).

"Synthesis And ... Carbon Nitride As A Novel ... And Solid Lubricae", Tribology Transactions vol. 36 (1993)p. 491 (Abstract).

*Primary Examiner*—Roy V. King
*Attorney, Agent, or Firm*—William L. Botjer

[57] ABSTRACT

A process for depositing carbon nitride films on substrates or work pieces by means of plasma assisted energy controlled ion beam deposition. The process produces microscopically smooth, nearly stress free, insulating and transparent carbon nitride thin films at room (or elevated) temperature. In the process the substrate, tool or other component to be coated is placed in a vacuum chamber at room temperature and is acted upon by a source of negative carbon ions and a high flux plasma source of nitrogen radicals. The source of $C^-$ ions is hydrogen free and provides particle energies suitable for the production of films of high quality carbon nitride. The source of the nitrogen flux provides a high density of nitrogen radicals to interact with the $C^-$ ion beam and coat the substrate with carbon nitride. In a further embodiment of the process, which provides an even higher deposition rate, a source of $N^+$ is added which provides charge neutralization and surface nitridation prior to deposition.

13 Claims, No Drawings

METHOD FOR PRODUCING CARBON NITRIDE FILMS

STATEMENT OF GOVERNMENT SUPPORT OF INVENTION

The work resulting in this invention was supported by the Ballistic Missile Defense Organization of the Department of Defense under contract No. DAA804-93-C-0022.

BACKGROUND AND SUMMARY OF THE INVENTION

This invention relates to an improved methodology for producing phases of carbon nitride (CN, $C_2N_2$, $C_3N_4$, .... $C_xN_y$) and particularly to methodology for producing films and coatings of $\beta$-$C_3N_4$.

Because of its previously unmatched physical properties, and particularly its hardness and wear resistance, diamonds and diamond or diamond like coatings have extremely important industrial applications. Diamond's hardness is determined by its bulk modulus which depends on the type of chemical bonding it has, which is covalent rather than ionic, and of the shortness of its bond length. Despite its otherwise impressive wear resistance when used as a coating, diamond has a serious failing in high temperature reactive environments: it is subject to graphitization degradation or oxidation at temperatures above $\approx 750$ deg. C. Indeed, the maximum operational temperature limit for diamond coated tools is usually lower than 300–400 deg C. Additionally, when used with cobalt compounds diamond is also subject to catalytic degradation. This degradation at elevated temperatures renders diamond coatings unusable in many real world applications, such as a coating for the turbine blades of a jet engine and high speed/high temperature tooling. Recently developed "superhard" materials such as cubic boron nitride (BN) and silicon nitride ($Si_3N_4$) are less hard than diamond due to their partially ionic bonds and longer bond lengths. The present application is directed to a process for producing, in a commercially usable manner, a material that has a hardness comparable to that of diamond but is also usable in environments of above 750 deg. C. which would destroy a diamond coating and through 1000 deg C.

The present invention is directed to methodology for producing the various phases of carbon nitride and particularly the so called $\beta$-$C_3N_4$ phase. Beta carbon nitride or $\beta$-$C_3N_4$ means carbon nitride that has the same configuration as $\beta$-$Si_3N_4$ (beta silicon nitride) with the silicon replaced by carbon. As used in this patent application carbon nitride means any of the multiple phases of $C_xN_y$, $\beta$-$C_3N_4$ and amorphous carbon nitride unless explicitly stated otherwise.

In a scientific paper based on theoretical calculations (Science, 25 Aug. 1989, p. 841) it was estimated that carbon nitride in the $\beta$-$C_3N_4$ configuration would have a bulk modulus (hardness) on the order of, or perhaps greater than, diamond. Naturally, this engendered many attempts to grow films of carbon nitride by many different methods. These methods include: pulsed laser ablation (Science, 16 Jul. 1993 p. 334), hot press sintering, shock combustion, reactive sputtering (U.S. Pat. No. 5,111,679), plasma arcs, E-beam evaporation and chemical vapor deposition. However these approaches have met with only limited success as they have not produced films of carbon nitride that have the correct bonding configuration between carbon and nitrogen for $\beta$-$C_3N_4$: C-N, single $sp^3$ bonding. The films produced by these methods have only a small percentage of single $sp^3$ bonds and/or are subject to contamination by hydrocarbons, most likely caused by hydrogen containing compounds used as reactants. We submit that these processes suffer from a common flaw in that they do not provide proper ion particle energy (which can be measured in particle electron volts) to form films of carbon nitride having a large majority (>90%) of the correct $sp^3$ bonds. Most of the processes previously used have particle energies of 20–80 eV while formation of the desired metastable carbon nitride state requires particle energies of 100–200 eV.

In U.S. patent application 08/328,806 filed Oct. 25, 1994, now U.S. Pat. No. 5,573,864 and assigned to the National Institute of Standards and Technology there is disclosed a process for producing carbon nitride using a $N^+$ ion beam and a sputtered C source. However, they were unable to effectively explore the important 100–200 eV energy range and their C source was not energy controlled. In a paper presented to the ASTM/STLE Tribology conference entitled "Synthesis and Tribological Properties of Carbon Nitride as a Novel Superhard Coating and Solid Lubricant" (ASTM/ STLE Tribology Transactions Vol. 36(1993),3, pp 491–493) a process for producing carbon nitride using sputtering of a graphite target in an nitrogen/argon plasma is disclosed. However in this process, as in all sputter processes, there is little control over the polarity and energy of the carbon, as there is a shower of $C^-$, $C^+$ and C ions and atoms of various energy levels, which prevents precise control of the process of forming the carbon nitride.

The present application is directed to a process for depositing carbon nitride films on substrates or work pieces by means of plasma assisted energy controlled carbon ion beam deposition. This technique has produced microscopically smooth, nearly stress free, insulating, and transparent carbon nitride thin films at room temperature, which contains approximately 95% pure C-N single bonds and approximately 50% atomic % of nitrogen. The friction coefficient and wear resistance of the films produced by the present process are comparable to that of diamond. Furthermore, the films produced do not show any deterioration or decrease in the number of pure $sp^3$ single C-N bonds after heating to 1000 deg. C in a vacuum or oxygen atmosphere, conditions that decompose a diamond or diamond/cobalt composites.

In the process according to the invention, the substrate or tool to be coated is placed in a vacuum chamber at room or elevated temperature and is acted upon by a source of negative carbon ions and a high flux plasma source containing nitrogen radicals. The source of $C^-$ ions is preferably hydrogen free and capable of providing particle energies in the 100–200 eV range which is required to produce films of true beta carbon nitride. The source of the nitrogen flux should be capable of providing a high density of nitrogen radicals to interact with the $C^-$ ion beam and thereby coat the substrate with carbon nitride. In a further embodiment of the process, which provides an even higher deposition rate, a source of $N^+$ is added which provides charge neutralization during deposition and can also be used for surface nitridation prior to deposition.

DESCRIPTION OF THE PREFERRED EMBODIMENTS

The coating of a tool, workpiece or substrate (hereinafter referred to as a substrate) with carbon nitride takes place in a standard high vacuum chamber used in conventional ion beam deposition processes. The workpiece, if its configuration so requires, may be mounted on a movable platen. A rotatable platen or sample holder may also be used to place multiple workpieces in the path of the deposition beams. The deposition process may take place at room temperature so that many materials that could not survive coating at elevated temperatures, such as plastics and cloth or materials with high outgassing rates, may be carbon nitride coated.

In a first embodiment of the process the substrate is acted upon by two beams: a first C⁻ ion beam and a plasma beam of nitrogen containing radicals, such as $N_2$ or ammonia $NH_3$. The C⁻ ion beam and the plasma beam are directed at the area of the substrate that is to be coated with carbon nitride. The variables in the process are the energy and flux of the C⁻ ion beam as well as the gas species, and the power and flux of the plasma beam. By way of example, successful carbon nitride deposition was achieved on a cleaned silicon substrate with a plasma power of 20 watts with the ion beam energy varied in the range from 50 to 150 eV. Nitrogen plasma power above 100 watts produced no deposition but etched the substrate. The plasma source was RF excited and the ion beam source was as is described in detail below (although alternate sources could have been used). The C⁻ ion beam current was approx. 80 uA with a 0.25" beam diameter which corresponds to a flux of $4 \times 10^{15}$ ions/cm².sec. with a beam energy in the 50–150 eV range The optimum energy window for the formation of carbon nitride was found to be in the area of 150 eV. The flow rate of $N_2$ or $NH_3$ gas directed at the substrate through the plasma source was controlled by a mass flow controller to about 10 sccm at a deposition pressure of approx. $10^{-4}$ Torr.

It is preferable that carbon be the ion beam and that nitrogen be in the reactive gas or ionized state. In an ion beam deposition process the bonding occurs when an energetic ion particle hits adsorbed or codepositing particles. The use of a nitrogen plasma beam provides a large amount of reactive nitrogen species to coat the surface of the substrate and provides a very chemically reactive species compared to nitrogen. The ion beam process forms the bond when the ion beam hits the adsorbed and previously bonded species at the proper energy ($\approx 150$ eV for carbon nitride). The greater the surface area coverage, the higher the number of atoms with the proper bonding cross section for film formation. The high surface area coverage is achieved by a high flux of reactive atomic nitrogen. The use of a nitrogen ion beam with carbon as the adsorbed species is also not preferred since there is a high chance of forming carbonaceous structures, other than carbon nitride, on the substrate. It is also easier to maintain a high "overpressure" of reactive nitrogen flux than carbon. As is discussed in detail below, a N⁺ ion beam may be used to advantage in a second embodiment of the inventive process.

It has also been found advantageous that the carbon ion beam be precisely energy controlled and that it be negative rather than positive, although this need not be a fundamental limit. This is because even though carbon nitride has a covalent bond structure there is an electrostatic dipole moment between the atoms (before bonding) with carbon being negative and nitrogen being positive. Hence, during the initial reaction, positive carbon ions will be repelled by nitrogen but a negative carbon ion will be attracted to a positive, neutral or excited nitrogen atom. It is also important that the carbon ions be generated in a hydrogen free process. Many processes generate carbon ions through a decomposition reaction of $CH_4$ or related hydrocarbon gases, this is undesirable as it may easily form hydrocarbon impurities in the carbon nitride.

In a second embodiment of the invention which provides a large increase in the deposition rate of carbon nitride, a source of N⁺ ions is added to the C⁻ ion source and the nitrogen plasma source. Carbon nitride is an insulating and non-magnetic material, however the impingement of the C⁻ ion beam during deposition can lead to charging effects that can reduce deposition rates. The use of the N⁺ ion beam directed on the substrate at the area of deposition will serve to neutralize the charge caused by the C⁻ ion beam. An N⁺ beam is ideal because it does not introduce any impurities in the carbon nitride and can be used to assist deposition, or, similar to the carbon ion beam, can be used for pre-deposition surface modification. Depending on substrate chemistries it may be preferable to initiate coating with one or more layers of nitrides or carbides. This is important for cobalt based tools where direct interaction of carbon and cobalt can be detrimental. A positive, energy controlled, nitrogen beam may also assist in optimizing $sp^3$ bond formation. Finally, the N⁺ beam is compatible with the use of an argon (or other gas) atmosphere during deposition which could be used for neutralization, deposition energy controlled reactions, chemically catalyzed reactions or mixed alloy formation.

A C⁻ ion beam source which is particularly suitable for use in this invention is found in U.S. patent application Ser. No. 08/281,480 filed Jul. 27, 1994 entitled "Negative Ion Beam Source", now U.S. Pat. No. 5,466,941, the disclosure of which is hereby incorporated by reference as if fully set forth herein. The ion beam source set forth in the incorporated application produces C⁻ beams by Cs⁺ sputtering of a graphite target. The Cs⁺ ions are produced by a hot tungsten ribbon by surface ionization and are directed to the graphite target by a series of shaped electrodes. The C⁻ ions emitted by the graphite target are shaped by various electrodes into an easily scalable rectangular beam which enables wide areas to be covered by the ion beam. The particle energy of the emitted ion beams may be adjusted from a few to several thousand eV and particularly to the 50–200 eV range used in the present process. This device is also capable of generating several mA/cm² of C⁻ ions which corresponds to $\approx 10^{17}$ C⁻ ions/cm²sec or several monolayers/sec and hence several microns/hr of deposition rate. Additionally, the energy distribution of the emitted ions is narrow, several eV, which permits subsequent precise energy control of the C⁻ ion beam, thereby controlling the bonds formed in the carbon nitride film by adjusting ion beam energy. The narrow energy distribution is achieved because Cs coating of the carbon target reduces its effective work function, allowing electrons to tunnel out of the surface and attach to slow moving ejected atoms (or molecules) thereby forming negative particles with a narrow energy distribution.

Another suitable negative ion sputtering source which is readily adaptable for use as a C⁻ source in this application is found in the paper entitled "Self-Extraction Negative Ion Source" in Rev. Sci. Instrum. 53(6), Jun. 1982 pp. 803–809. Other ion source configurations are described in G. D. Alton, "Nuclear Instruments and Methods in Physics Research" B73 (1993) pp. 221–288.

In recent years there has been developed many plasma sources suitable for use as the nitrogen radical plasma source in the present process. Such sources include DC discharge, RF and microwave sources operating both with and without magnetic field and ECR sources. The present deposition process has successfully used a simple, high density, low pressure RF activated plasma source. Where greater surface area coverage is desired, such as in conjunction with the ion source described above, a plasma source such as a "hollow cathode" source or other linear plasma sources may be advantageously utilized. The positive nitrogen neutralization source is not critical and may be implemented by a conventional hot cathode plasma ion source.

In addition to β-$C_3N_4$ the present methodology may be used to form other phases of carbon nitride such as CN, $C_2N_2$ ($C_xN_y$) as well as amorphous carbon nitride.. These phases can be produced by adjusting the process parameters such as the flux density of the ion beam, the plasma energy and the ratio of carbon to nitrogen species at the substrate. Furthermore the amount of $Sp^3$ bonds can be altered by adjusting the energy of the ion beam. Many other nitrogen or carbon based gases may also be used in the inventive process. Alternatively, by replacing the carbon source with other elements or compounds (X) that form negative ions when sputtered from a low work function surface, a variety of $X_xN_y$ compounds can be formed. Further by turning off the nitrogen sources a variety of amorphous carbon phases (including diamond) can be formed.

The present process is also applicable to the formation of material systems other than carbon nitride. For example, diamond films have been formed by the $C^-$ ion beam (without the Nitrogen plasma) at ion energies in the area of 80 eV. Similarly, any material that can preferentially be sputtered as a negative ion can replace the graphite/carbon target and be formed in this system. Furthermore, other gases (Y) can be used as the plasma source so as to allow formation of a wide variety of metastable compounds $X_xY_y$. Accordingly, a wide variety of films can be produced at room temperature and with minimal resulting stress. Exemplary materials include W, BN, SiC, CrC, NbC, ZN, HfC and the like.

The invention has been described with respect to preferred embodiments. However, as those skilled in the art know, modifications and variations in the specific details which have been described and illustrated may be resorted to without departing from the spirit and scope of the invention as defined in the appended claims.

What is claimed is:

1. A method for coating carbon nitride on a substrate, comprising the steps of:
   a) placing said substrate in a vacuum chamber;
   b) evacuating said vacuum chamber;
   c) providing a beam of negative carbon ions having a particle energy of from 100 to 200 eV;
   d) providing a plasma beam containing nitrogen radicals;
   e) directing said plasma beam containing nitrogen radicals at a predetermined area of said substrate so that said nitrogen radicals are adsorbed on the surface of said substrate; and
   f) directing said beam of negative carbon ions onto the substrate at the area where said nitrogen radicals are adsorbed so as to interact with said plasma beam containing nitrogen radicals to form the carbon nitride on said area of said substrate.

2. The method as claimed in claim 1 wherein said ion beam has a particle energy of approximately 150 eV.

3. The method as claimed in claim 1 further including the step of providing a source of positive nitrogen ion and directing the positive nitrogen ions at said substrate.

4. The method as claimed in claim 3 further including the step of utilizing the source of at least one of said carbon ions and said nitrogen ions to treat the surface of the substrate.

5. The method as claimed in claim 1 wherein the nitrogen radicals forming the plasma beam are derived from gases of at least one of nitrogen and ammonia.

6. The method as claimed in claim 1 wherein the beam of negative carbon ions is derived from a source of carbon that is hydrogen free.

7. The method as claimed in claim 1 further including the step of displacing the substrate during the deposition process.

8. A method for coating carbon nitride on a substrate, comprising the steps of:
   a) placing said substrate in a vacuum chamber;
   b) evacuating said vacuum chamber;
   c) providing a beam of negative carbon ions having a particle energy of from 100–200 eV;
   d) providing a plasma beam containing nitrogen radicals;
   e) providing a source of positive nitrogen ions and directing the positive nitrogen ions at said substrate;
   f) directing said plasma beam containing nitrogen radicals at a predetermined area of said substrate so that said nitrogen radicals are adsorbed on the surface of said substrate; and
   g) directing said beam of carbon ions onto the substrate at the area where said nitrogen radicals are adsorbed so as to interact with said plasma beam containing nitrogen radicals to form the carbon nitride on said area of said substrate.

9. The method as claimed in claim 8 wherein said ion beam has a particle energy of approximately 150 eV.

10. The method as claimed in claim 8 further including the step of utilizing the source of at least one of said carbon ions and said nitrogen ions to treat the surface of the substrate.

11. The method as claimed in claim 8 wherein the nitrogen radicals forming the plasma beam are derived from gases of at least one of nitrogen and ammonia.

12. The method as claimed in claim 8 wherein the beam of negative carbon ions is derived from a source of carbon that is hydrogen free.

13. The method as claimed in claim 8 further including the step of displacing the substrate during the deposition process.

* * * * *